United States Patent [19]

Scepanovic et al.

[11] Patent Number: 5,712,793
[45] Date of Patent: Jan. 27, 1998

[54] PHYSICAL DESIGN AUTOMATION SYSTEM AND PROCESS FOR DESIGNING INTEGRATED CIRCUIT CHIPS USING FUZZY CELL CLUSTERIZATION

[75] Inventors: Ranko Scepanovic; James S. Koford, both of San Jose, Calif.; Valeriy B. Kudryvavtsev, Moscow, Russian Federation; Alexander E. Andreev, Moskovskaja Oblast, Russian Federation; Stanislav V. Aleshin; Alexander S. Podkolzin, both of Moscow, Russian Federation; Edward M. Roseboom, San Carlos, Calif.

[73] Assignee: LSI Logic Corporation, Milpitas, Calif.

[21] Appl. No.: 560,588

[22] Filed: Nov. 20, 1995

[51] Int. Cl.$^6$ ................................................ G06F 17/50
[52] U.S. Cl. ................................ 364/490; 364/491
[58] Field of Search ............................. 364/488, 489, 364/490, 491

[56] References Cited

U.S. PATENT DOCUMENTS

| | | | |
|---|---|---|---|
| 4,626,966 | 12/1986 | Yamada et al. | 364/491 |
| 5,191,542 | 3/1993 | Murofushi | 364/491 |
| 5,309,371 | 5/1994 | Shikata et al. | 364/491 |
| 5,359,538 | 10/1994 | Hui et al. | 364/491 |
| 5,398,195 | 3/1995 | Kim | 364/491 |
| 5,513,119 | 4/1996 | Moore et al. | 364/491 |

OTHER PUBLICATIONS

H. Onodera et al.; A Block Placement Procedure Using A Force Model; 1990 Scripta Technica, Inc., pp. 87–96.

K. Ueda et al.; CHAMP: Chip Floor Plan For Hierarchical VLSI Layout Design;1985 IEEE, vol. CAD–4 No. 1 pp. 12–22.

N.R. Quinn, Jr. et al.; A Forced Directed Component Placement Procedure For Printed Circuit Boards; 1979 IEEE; pp. 377–388.

C. Sechen et al.; An Improved Simulated Annealing Alogorithm For Row-Based Placement; 1989 IEEE; pp.478–481.

C.M. Fiduccia et al.; A Linear–Time Heuristic For Improving Network Partitions; 1982 IEEE, Paper 13.1; pp. 175–181.

*Primary Examiner*—Kevin J. Teska
*Assistant Examiner*—Leigh Marie Garbowski
*Attorney, Agent, or Firm*—Oppenheimer Poms Smith

[57] ABSTRACT

A computer implemented method for generating and placing clusters of cells for integrated circuit design includes providing a netlist including cells, and nets of wires interconnecting the cells. A metric is specified for measuring distance between cells as a function of netlist interconnections. A length of a net is the number of cells interconnected by said net minus one, and a distance between two cells is a sum of lengths of nets that provide a shortest path between the cells. A maximum cluster size criterion, such as maximum distance of a cell from the center of a cluster, is specified to provide a desired amount of overlap between clusters. Clusters of cells are generated, each cluster being generated by designating one of the cells as the center, processing the netlist using the metric to determine distances of cells from the center, and assigning cells having progressively increasing distances from the center to the cluster until the maximum cluster size criterion is reached. Affinities between pairs of clusters are calculated, and the clusters are placed using force directed placement or other methodology based on the affinities.

36 Claims, 5 Drawing Sheets

PHYSICAL DESIGN AUTOMATION SYSTEM AND PROCESS FOR DESIGNING INTEGRATED CIRCUIT CHIPS USING FUZZY CELL CLUSTERIZATION

BACKGROUND OF THE INVENTION

1. Field of the Invention

The present invention generally relates to the art of microelectronic integrated circuits, and more specifically to a physical design automation system and process for designing integrated circuit chips using fuzzy cell clusterization.

2. Description of the Related Art

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design. It is an extremely tedious and an error-prone process because of the tight tolerance requirements and the minuteness of the individual components.

Currently, the minimum geometric feature size of a component is on the order of 0.5 microns. However, it is expected that the feature size can be reduced to 0.1 micron within several years. This small feature size allows fabrication of as many as 4.5 million transistors or 1 million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

The objective of physical design is to determine an optimal arrangement of devices in a plane or in a three dimensional space, and an efficient interconnection or routing scheme between the devices to obtain the desired functionality. Since space on a wafer is very expensive real estate, algorithms must use the space very efficiently to lower costs and improve yield. The arrangement of individual cells in an integrated circuit chip is known as a cell placement.

Each microelectronic circuit device or cell includes a plurality of pins or terminals, each of which is connected to pins of other cells by a respective electrical interconnect wire network or net. A goal of the optimization process is to determine a cell placement such that all of the required interconnects can be made, and the total wirelength and interconnect congestion are minimized.

Prior art methods for achieving this goal comprise generating one or more initial placements, modifying the placements using optimization methodologies including Genetic Algorithms such as simulated evolution, force directed placement or simulated annealing, and comparing the resulting placements using a cost criteria.

In conventional chip design, the positions of certain "unmovable" cells (external interconnect terminals or pads, large "megacells" etc.) will be fixed a priori by the designer. Given those fixed positions, the rest of the cells are then placed on the chip. Since the unmovable cells and pads are located or placed before the placement for the rest of the cells of chip has been decided on, it is unlikely that the chosen positions will be optimal.

In this manner, a number of regions, which may have different sizes and shapes, are defined on the chip for placement of the rest of the cells.

It is desirable to assign individual microelectronic devices or cells to the regions, or "partition" the placement such that the total interconnect wirelength is minimized. However, methodologies for accomplishing this goal efficiently have not been proposed heretofore.

The general partitioning methodology is to hierarchically partition a large circuit into a group of smaller subcircuits until each subcircuit is small enough to be designed efficiently. Because the quality of the design may suffer due to the partitioning, the partitioning of a circuit has to be done carefully.

One of the most common objectives of partitioning is to minimize the cutsize which is defined as a number of nets crossing a cut. Also the number of partitions often appears as a constraint with upper and lower bounds. At chip level, the number of partitions is determined, in part, by the capability of the placement algorithm.

The prior art accomplishes partitioning by means of a series of "bipartitioning" problems, in which a decision is made to assign a component to one of two regions. Each component is hierarchically bipartitioned until the desired number of components is achieved.

Numerous methodologies for cell placement and assignment are known in the art. These include quadratic optimization as disclosed in an article entitled "GORDIAN: VLSI Placement by Quadratic Programming and Slicing Optimization", by J. Kleinhans et al, IEEE Trans. on CAD, 1991, pp. 356–365, and simulated annealing as described in an article entitled "A Loosely Coupled Parallel Algorithm for Standard Cell Placement", by W. Sun and C. Sechan, Proceedings of IEEE/ACM IC-CAD Conference, 1994, pp. 137–144.

Prior art methods can not simultaneously solve the partitioning problem and the problem of placing partitions on the chip, and thereby their applicability to physical design automation systems for integrated circuit chip design is limited.

More specifically, prior art methods do not provide any metric for specifying distances between cells based on netlist connections. An initial placement must be performed to establish physical locations for cells and thereby distances therebetween.

Also, prior art methods fix cells in clusters at the beginning of optimization, and do not provide any means for allowing cells to move between clusters as optimization proceeds. This can create areas of high routing congestion, which cannot be readily eliminated because cell movements between clusters which could relieve the congestion are not allowed.

SUMMARY OF THE INVENTION

The present invention overcomes the problems of the prior art by providing a new "metric", or distance measurement method, which operates only on the netlist.

The netlist can be represented as a "hypergraph", including a number of "hyperedges" that interconnect vertices. The hyperedges correspond to the wiring nets respectively, and the vertices correspond to the cells that are interconnected by the nets.

A net or hyperedge specifies that certain cells (vertices) are to be interconnected, but does not provide any information relating to a physical interconnect arrangement or routing. For this reason, a netlist per se does not include any information regarding distances between cells or vertices.

The new metric provided by the present invention enables quantitative distances between cells to be specified, even though these distances are based entirely on netlist interconnections and do not have any actual physical basis. The metric is generic, and independent of the initial placement. The new metric is combined with principles from "fuzzy" logic to allow diffusion of clusters during the optimization process and generate a dynamic hierarchical solution.

As opposed to prior art clusterization methods that generate crisp clusters of cells that can be placed hierarchically, the present method generates fuzzy clusters such that a given cell can belong to two or more clusters. In other words, the clusters can overlap. This enables a decision as to which cells belong to which cluster and thereby the routing pattern to be delayed for the purpose of producing an ultimate cell placement which not only has minimum wirelength, but is also routable.

More specifically, a computer implemented method for generating and placing clusters of cells for integrated circuit design according to the present invention includes providing a netlist including cells, and nets of wires interconnecting the cells.

A metric is specified for measuring distance between cells as a function of netlist interconnections. A length of a net is the number of cells interconnected by said net minus one, and a distance between two cells is a sum of lengths of nets that provide a shortest path between the cells.

A maximum cluster size criterion, such as maximum distance of a cell from the center of a cluster, is specified to provide a desired amount of overlap between clusters. Fuzzy clusters or "neighborhoods" of cells are generated, each cluster being generated by designating one of the cells as the center, processing the netlist using the metric to determine distances of cells from the center, and assigning cells having progressively increasing distances from the center to the cluster until the maximum cluster size criterion is reached.

Affinities between pairs of clusters are calculated, and the clusters are placed using force directed placement or other methodology based on the affinities.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
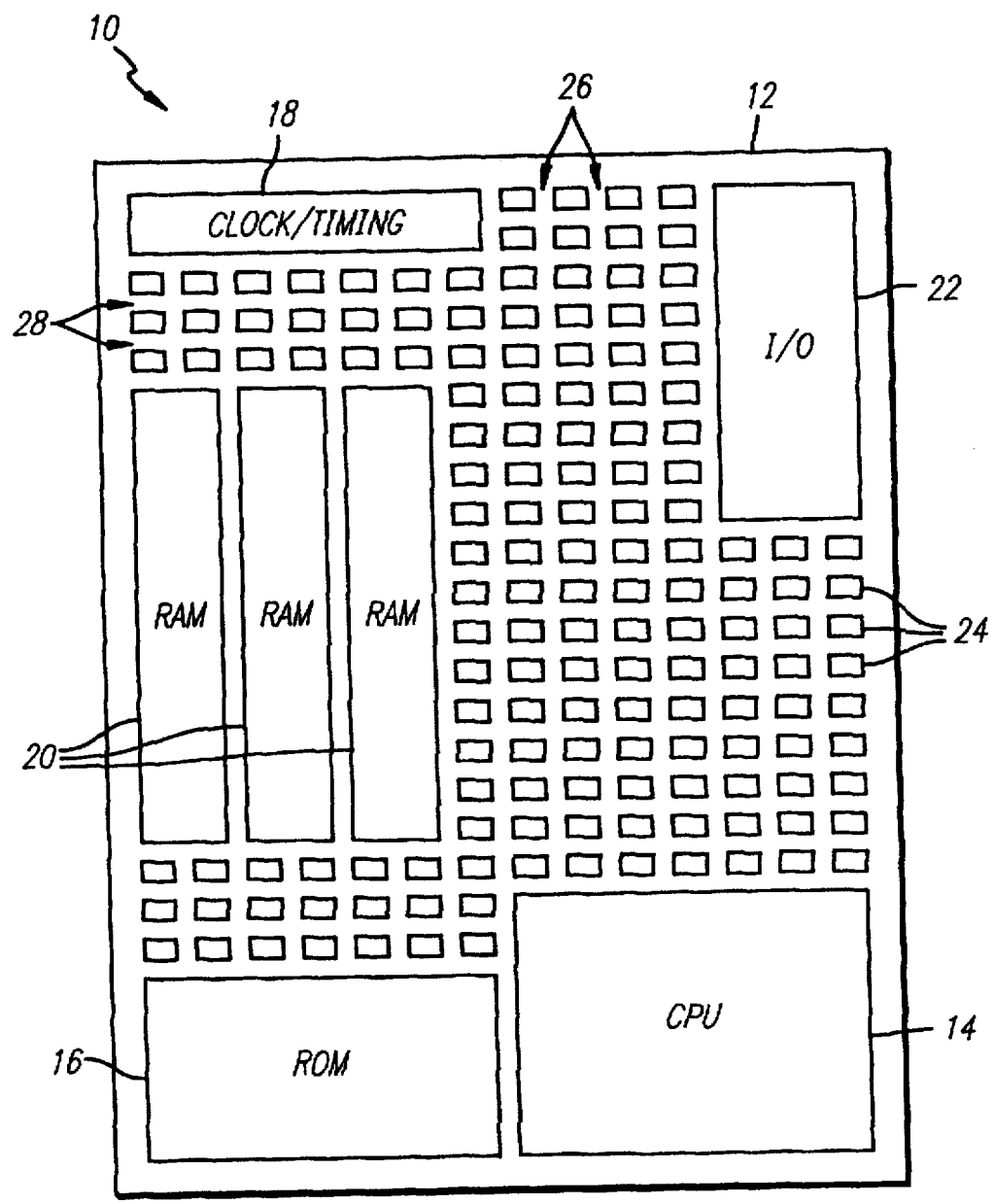
FIG. 1 is a simplified diagram illustrating an integrated circuit chip which can be optimally designed in accordance with the present invention.

An exemplary integrated circuit chip is illustrated in FIG. 1 and generally designated by the reference numeral 10. The circuit 10 includes a semiconductor substrate 12 on which are formed a number of functional circuit blocks that can have different sizes and shapes. Some are relatively large, such as a central processing unit (CPU) 14, a read-only memory (ROM) 16, a clock/timing unit 18, one or more random access memories (RAM) 20 and an input/output (I/O) interface unit 22. These blocks can be considered as modules for use in various circuit designs, and are represented as standard designs in circuit libraries.

The integrated circuit 10 further comprises a large number, which can be tens of thousands, hundreds of thousands or even millions or more of small cells 24. Each cell 24 represents a single logic element, such as a gate, or several logic elements that are interconnected in a standardized manner to perform a specific function. Cells 24 that consist of two or more interconnected gates or logic elements are also available as standard modules in circuit libraries.

The cells 24 and the other elements of the circuit 10 described above are interconnected or routed in accordance with the logical design of the circuit to provide the desired functionality. Although not visible in the drawing, the various elements of the circuit 10 are interconnected by electrically conductive lines or traces that are routed, for example, through vertical channels 26 and horizontal channels 28 that run between the cells 24.

Figure 2:
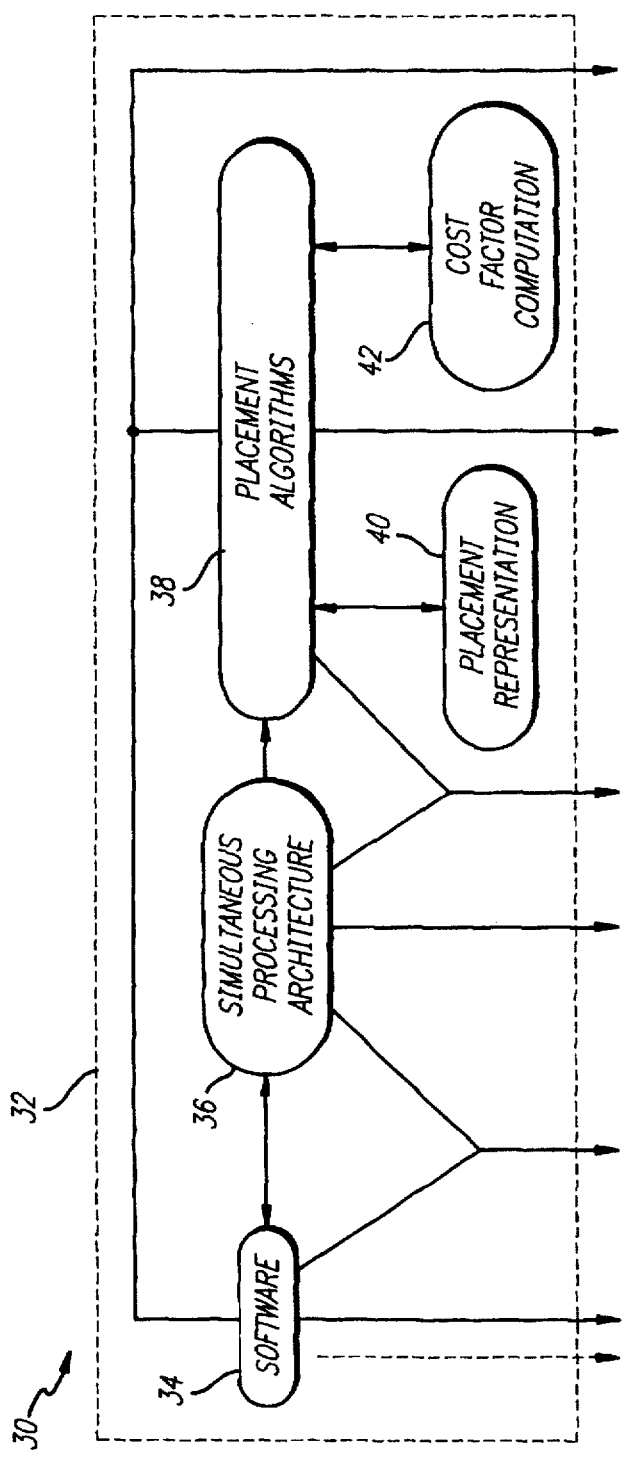
FIG. 2 is a diagram illustrating the main blocks of a multi-processing optimization system for practicing a method of the present invention.

FIG. 2 illustrates an integrated circuit physical design automation system 30 for producing an optimized placement of the cells 24 such as illustrated in FIG. 1 in accordance with a method of the present invention.

As will become evident from further description, system 30 is embodied as a programmed digital computer which generally comprises a processing means, memory means, and operating program which is stored in the memory means and executed by the processing means. The processing means preferably comprises a plurality of parallel processors for operating on a large number of areas of an integrated circuit cell placement concurrently.

The system 30 receives inputs for a user specified integrated circuit design including a netlist, a library of standardized microelectronic elements or cells and functional units including combinations of cells, and a set of rules that define the objectives of the design.

The architecture 36 collectively implements the required functionality of the present process by assigning different parallel processors to perform operations serially and/or concurrently, and combining the results thereof.

More specifically, the architecture 36 decomposes these functions into a plurality of parallel processes or tasks that are executed simultaneously using individual processing units. In general, one or more processors coordinate the operation of other processors, which are optimized, evaluated and recombined to produce an optimal cell placement which may or may not satisfy a predetermined performance objective.

The optimal cell placement produced by the system 30 is used to generate masks for fabrication of the desired integrated circuit chip.

The system 30 comprises a global operating system 32 that generally controls and coordinates the operation of parallel processing software 34 and simultaneous processing architecture 36.

The architecture 36 includes a plurality of parallel processors and a memory structure for simultaneously executing methodologies or placement algorithms 38 for measuring the relative costs of cell placements and minimizing the costs. Implementation of the algorithms 38 is facilitated by a cell placement representation 40 and cost function or factor computation 42. The architecture 36 can be of any type, such as Distributed Shared Memory (DSM), that enables parallel processing in accordance with the method of the invention.

In accordance with the present invention, the netlist is represented as a "hypergraph", including a number of "hyperedges" that interconnect vertices. The hyperedges correspond to the wiring nets, and the vertices correspond to the cells that are interconnected by the nets respectively.

The new metric provided by the present invention enables quantitative distances between cells to be specified, even though these distances are based entirely on netlist interconnections and do not have any actual physical basis. The metric is generic, and independent of the initial placement. The new metric is combined with principles from "fuzzy" logic to allow diffusion of clusters during the optimization process and generate a dynamic hierarchical solution.

As opposed to prior art clusterization methods that generate crisp clusters of cells that can be placed hierarchically, the present method generates fuzzy clusters such that a given cell can belong to two or more clusters. In other words, the clusters can overlap. This enables a decision as to which cells belong to which cluster and thereby the routing pattern to be delayed for the purpose of producing an ultimate cell placement which not only has minimum wirelength, but is also routable.

In accordance with the present metric, the "length" $l(q)$ of a wiring net or hyperedge is equal to the number of pins (vertices) that are interconnected by the net minus one. This can be represented mathematically as $l(q)=|q|-1$, where q is the net and $|q|$ is the number of pins that are interconnected by the net q.

It will be understood that a particular cell, especially a large cell, can have two or more pins that are interconnected by one net q, and for this reason $|q|$ is the number of pins rather than the number of cells that are interconnected by a net q. However, for simplicity of description and illustration, the following examples will assume that each cell has only one pin connected to each net.

Figure 3:
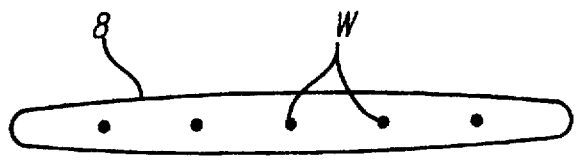
FIG. 3 is a diagram illustrating calculation of a length of an cell interconnect net or hypergraph edge.

An example is illustrated in FIG. 3. A net q is shown as interconnecting 5 cells that are collectively designated as w. The length of the net q is $(5-1)=4$. The cells w are illustrated as being spaced from each other and enclosed in an oblong shape which represents the net q. This is for illustrative purposes only, as it will be understood that the net q does not have any specific shape, and merely specifies that individual pins (not shown) of the cells w are to be interconnected.

A distance $\rho(v_1, v_2)$ between two given vertices $v_1$ and $v_2$ is defined as the length of the shortest path between the vertices, where the length of a path is the sum of the lengths of the nets (hyperedges) that constitute the path.

Figure 4:
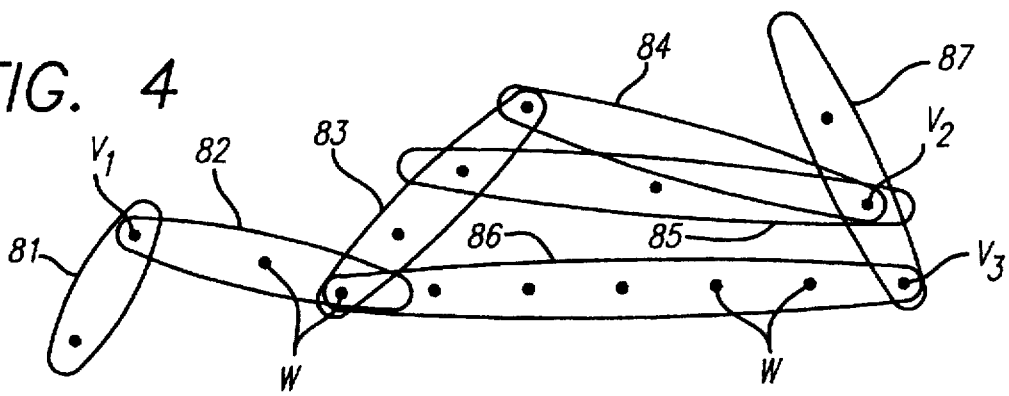
FIG. 4 is a diagram illustrating calculation of a distance from a cell to a net, and a "range" of a net.

FIG. 4 illustrates seven nets $q_1$ to $q_7$, each of which interconnect a plurality of cells w. The distance between two given cells or vertices $v_1$ and $v_2$ is the length of the shortest path through the nets $q_1$ to $q_7$ that interconnects the cells.

The cell $v_1$ is common to the nets $q_1$ and $q_2$. However, there is no path from the cell $v_1$ to the cell $v_2$ through the net $q_1$.

There is a path from the cell $v_1$ to the cell $v_2$ through the nets $q_2$, $q_3$ and $q_4$, and another path through the nets $q_2$, $q_3$ and $q_5$. The lengths of the nets $q_2$, $q_3$, $q_4$ and $q_5$ are $(3-1)=2$, $(4-1)=3$, $(2-1)=1$, and $(3-1)=2$ respectively. The length of the path through the nets $q_2$, $q_3$ and $q_4$ is $(2+3+1)=6$, and the length of the path through the nets $q_2$, $q_3$ and $q_5$ is $(2+3+2)=7$. The path through the nets $q_2$, $q_3$ and $q_4$ has the shorter length, more specifically 6. If there is no other path (not shown) that is shorter, the distance between the cells $v_1$ and $v_2$ is defined as the length of this path.

FIG. 4 also illustrates how to measure a distance $\rho(v,q)$ between a cell v and a net q. This distance can be expressed mathematically as $\rho(v,q)=\min_{w \in q}\rho(v,w)$, and is the shortest path between the vertex v and any pin w in the net q.

Measurement of the distance between the cell $v_1$ and the net $q_7$ will be taken by way of example. There is a path from the cell $v_1$ to a cell $v_3$ in the net $q_7$. The length of this path is the sum of the lengths of the nets $q_2$ and $q_6$, which has a value of $(2+6)=8$. However, the path from the cell $v_1$ to the vertex $v_2$ through the nets $q_2$, $q_3$ and $q_4$ is the shorter path between the cell $v_1$ and any cell w in the net $q_7$, having a value of 6 as described above. If there is no other path (not shown) that is shorter, the distance between the vertex $v_1$ and the net $q_7$ is therefore defined to be 6.

In accordance with the present metric, a "range" $range_v(q)$ of a net q from a center cell v of a cluster or neighborhood (to be described in detail below) can be expressed mathematically as $range_v(q)=\rho(v,q)+l(q)$. In other words, the range is the distance from the center cell v to the net q plus the length of the net. The range of the net $q_7$ from the cell $v_1$, for example, is equal to the distance $\rho(v,q)$ from the cell $v_1$ to the net $q_7$, plus the length of the net $q_7$, or $(6+2)=8$.

One further definition is necessary for understanding the present invention. A "border" is a list of all nets that have ranges equal to the index of the border. For example, a border having an index of 7 ($border_7$) is a list of all nets having ranges of 7. This can be expressed mathematically as $border_v(j)=$all nets q such that $\rho(v,q) \leq r$ and $range_v(q)=j$, where j is the index of the border and r is a predetermined maximum distance from the center cell v (to be described in detail below) to the net q.

The borders can be considered as a series of concentric shells or quantum levels, with each border having an incrementally higher index and including nets having an incrementally higher range than the border with the next lower index.

Figure 5:
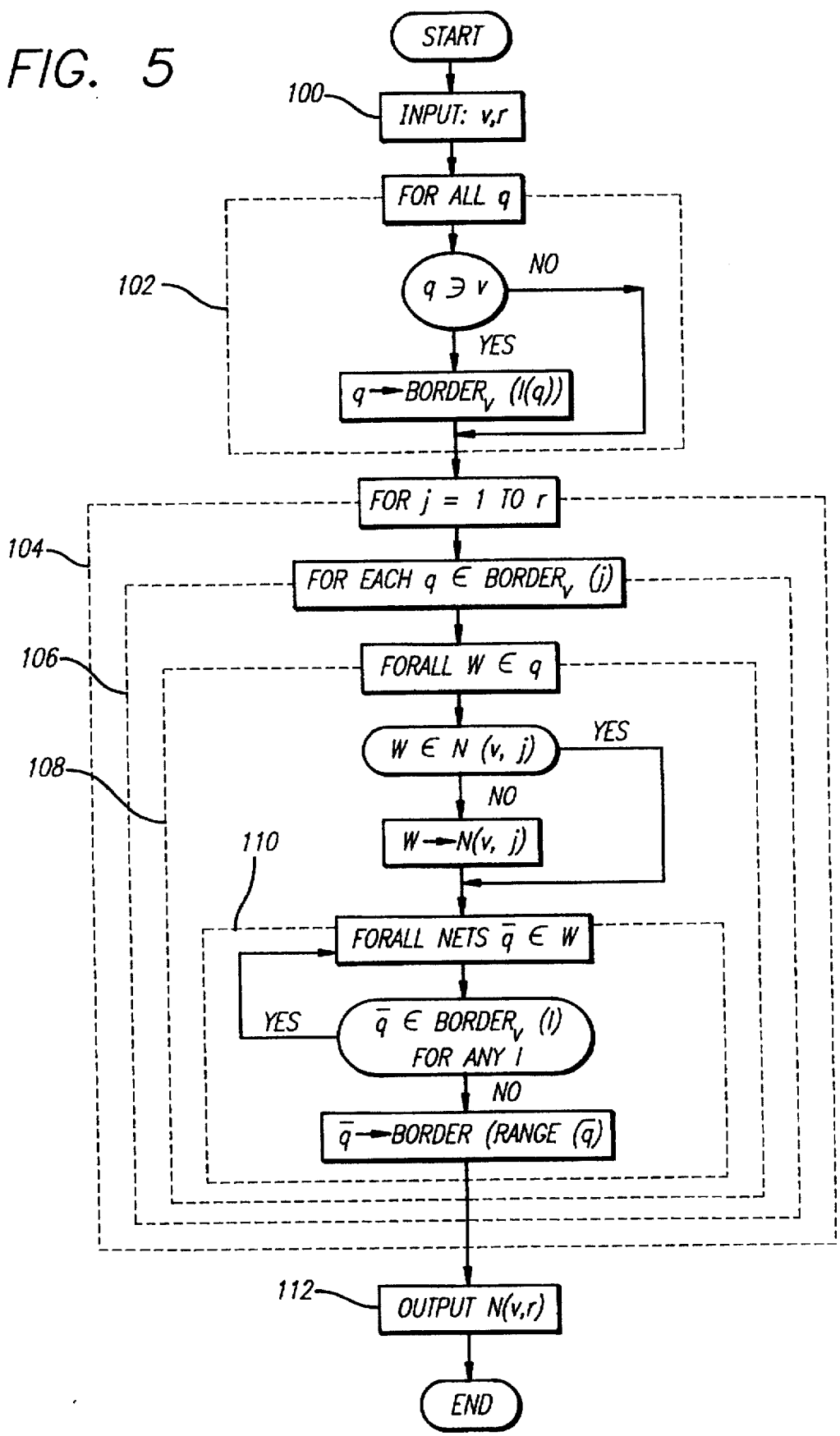
FIG. 5 is a block diagram illustrating generation of a fuzzy cluster or "neighborhood" in accordance with the present invention.

FIG. 5 is a flowchart illustrating the formation of a cell cluster or "neighborhood" N(v,r) in accordance with the present invention. The term "neighborhood" is illustrative of the fact that the clusters can be "fuzzy", with one cell being included in two or more clusters, and two or more clusters being allowed to overlap.

The first step is to specify a particular cell v to constitute the center of the cluster N, and a maximum radius r for the cluster as indicated in a step 100. A larger radius will allow more overlap between clusters, and movement of individual cells between clusters during a placement operation which will be described in detail below. This is illustrated in FIG. 8, in which adjacent clusters $N_1$ overlap each other, and also all of the clusters $N_1$ can overlap.

Figure 8:
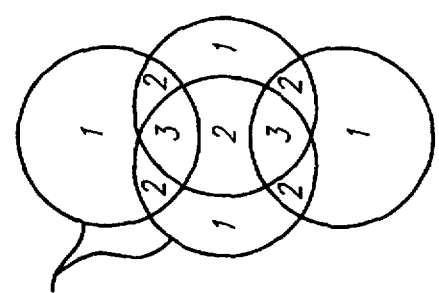
FIGS. 8 and 9 are diagrams illustrating cell cluster arrangements with large and small amounts of overlap or "fuzziness" respectively.

In FIG. 8, numerical values are assigned to areas depending on the number of overlapping clusters $N_1$. The value 1 means that there is no overlap (the area is covered by only one cluster). The values 2, 3 and 4 indicate the area is overlapped by two, three and four clusters respectively, with all clusters overlapping in the area with the value 4.

Figure 9:
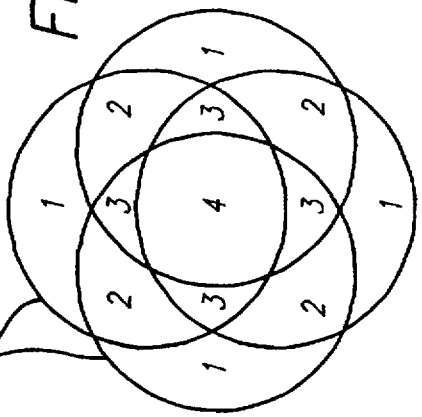

FIG. 9 illustrates smaller clusters $N_2$. Reducing the cluster size reduces the fuzziness. When the clusters are so small that there is no overlap, the clusters can be considered "crisp" rather than fuzzy.

The clusters $N_2$ also overlap adjacent clusters as indicated by the overlap values 1 to 4. The amount of overlap of the clusters $N_2$ is smaller than the amount of overlap of the clusters $N_1$ of FIG. 8. In FIG. 9, there is no area in which all clusters $N_2$ overlap (value 4).

A larger number of smaller clusters are required to cover or include all nets. Smaller clusters allow a finer resolution for optimal placement of individual cells.

The maximum distance or radius r is selected to correspond to a fuzzy parameter ∈ which specifies the desired amount of overlap between clusters or neighborhoods. The radius determines the size and number of clusters as described above.

The flowchart of FIG. 5 includes a plurality of nested loops indicated by broken lines. This notation indicates that all of the steps included within each loop are to be performed for all outer loops.

A step 102 which follows the first step 100 of inputting values of v and r is to determine which nets include the center cell v, and assigning all these nets to corresponding borders.

The next step, designated as 104, is to examine all borders, starting with borders, in increasing order of index.

The next step 106 is to assign nets to borders in index order. A step 108 includes assigning all cells which are not in the neighborhood from the nets in the current border to the neighborhood. A step 110 includes assigning all nets which contain cells just included in the neighborhood, if these nets have not been previously assigned to any border, to corresponding borders. The cluster or neighborhood N(v,r) is output in a step 112.

Figure 6:
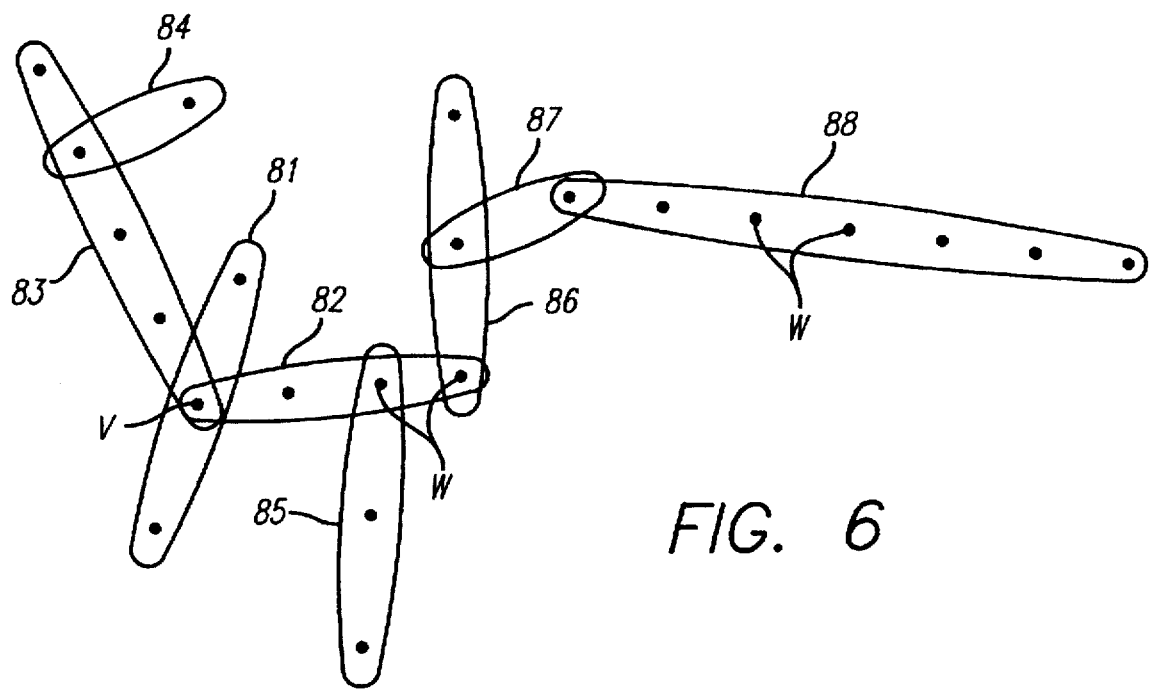
FIG. 6 is a diagram illustrating of a "border" structure for a cell cluster.

The method of FIG. 5 will be described further with reference being made to an example illustrated in FIG. 6. This example includes a center cell v and nets $q_1$ to $q_8$.

Step 102 includes assigning all nets that include the center cell v to borders. The nets $q_1$, $q_2$ and $q_3$ all include the center cell v. Since the distances from the center cell v to these nets is zero, the ranges of these nets are equal to their lengths.

The net $q_1$ has a length of (3−1)=2, and is assigned to border$_2$. The nets $q_2$ and $q_3$ have lengths 3 and 4, and are assigned to the borders border$_3$ and border$_4$ respectively.

In steps 104 and 106, the borders are examined in increasing order of index to determine if they include any nets. Border$_1$ does not include any nets. Border$_2$ includes the net $q_1$. Therefore, step 108 is performed, in which all cells w in the net $q_1$ are assigned to the cluster or neighborhood N(v,j).

In step 110, it is determined if there are any other nets connected to cells that were just assigned to the neighborhood. In this case, there are not, and the processing returns to step 104 to examine the next border.

The next border is border$_3$ which contains the net $q_2$. All of the cells w in the net $q_2$ (except v) are assigned to the neighborhood. The method then performs step 110 to determine if any other nets $\tilde{q}$ include any of the cells w (just included in the neighborhood) of the net $q_2$. In the illustrated example, the nets $q_5$ and $q_6$ include cells which are also included in the net $q_2$, and are thereby connected to the net $q_2$. If these nets have not been assigned to borders, then they are now assigned to the borders having indices equal to their ranges respectively. The ranges of both nets $q_5$ and $q_6$ are 5, so these nets are assigned to border$_5$.

The steps 104 and 106 are then performed for the next border, more specifically border$_4$ which includes the net $q_3$. In step 108, all cells of the net $q_3$ are assigned to the cluster or neighborhood. Then, step 110 is performed to determine if any other nets $\tilde{q}$ include cells which are also included in the net $q_3$. In this case, the net $q_4$ is connected to the net $q_3$. The net $q_4$ has a range of 5, and is assigned to border$_5$.

The next border is border$_r$, which contains the nets $q_4$, $q_5$ and $q_6$. No other nets are connected to $q_4$ and $q_5$, but all of the cells of the nets $q_4$ and $q_5$ are assigned to the cluster. All of the cells of the net $q_6$ are also assigned to the cluster. The net $q_6$ is connected to the net $q_7$, and $q_7$ is added to border$_6$.

Examination of the next border, border$_6$, reveals in contains the net $q_7$. All cells of the net $q_7$ are assigned to the cluster, if they were not assigned previously. Since the net $q_8$ is connected to the net $q_7$, the net $q_8$ may also be added to the cluster. The net $q_8$ has a range of 11, and may be assigned to border$_{11}$.

It will be recalled that step 100 includes specifying a value of maximum range of a net or distance from the center v (radius r), which constitutes a maximum cluster size criterion. The radius r determines the size of the clusters. The radius r has a numerical value that corresponds to an index of a border.

If, for example, r=10, all of the cells of nets in borders 1 to 10 will be assigned to the cluster, and the process illustrated in FIG. 5 will be completed. The net $q_8$ will not be included in the cluster, because it has a range of 11 which is larger than 10. If, however, r was specified to have a larger value, for example 13, then the net $q_8$ and all of the cells thereof would be included in the cluster.

In this manner, clusters or neighborhoods are grown one border at a time until a maximum size is reached. In addition, the borders are grown by "hitting" nets having corresponding ranges through net interconnections starting at the center cell v.

Alternative criterion are available for limiting the maximum size of the clusters other than distance from the center as described above. For example, growth of clusters can be terminated when the cluster size exceeds (rather than becomes equal to) the maximum size criterion. In this case, cluster growth will terminate when the cluster size is not smaller than the maximum size criterion.

Alternatively, the maximum size criterion can be the number of cells, total area of cells, or the total height or width of the cells. The latter criterion is applicable where the cells have the same width or height respectively.

The description thus far has been limited to the formation of a single cluster or neighborhood. For cell placement and routing in practical integrated circuit design, clusterization is performed such that all cells are assigned to clusters depending on their netlist interconnections such that the most closely associated cells are clustered together. Then, a placement operation is performed such that the clusters are assigned to physical locations relative to each other on the plane of the integrated circuit chip.

This process is preferably performed hierarchically, starting with large clusters and proceeding to progressively smaller clusters as will be described in detail below.

Figure 7:
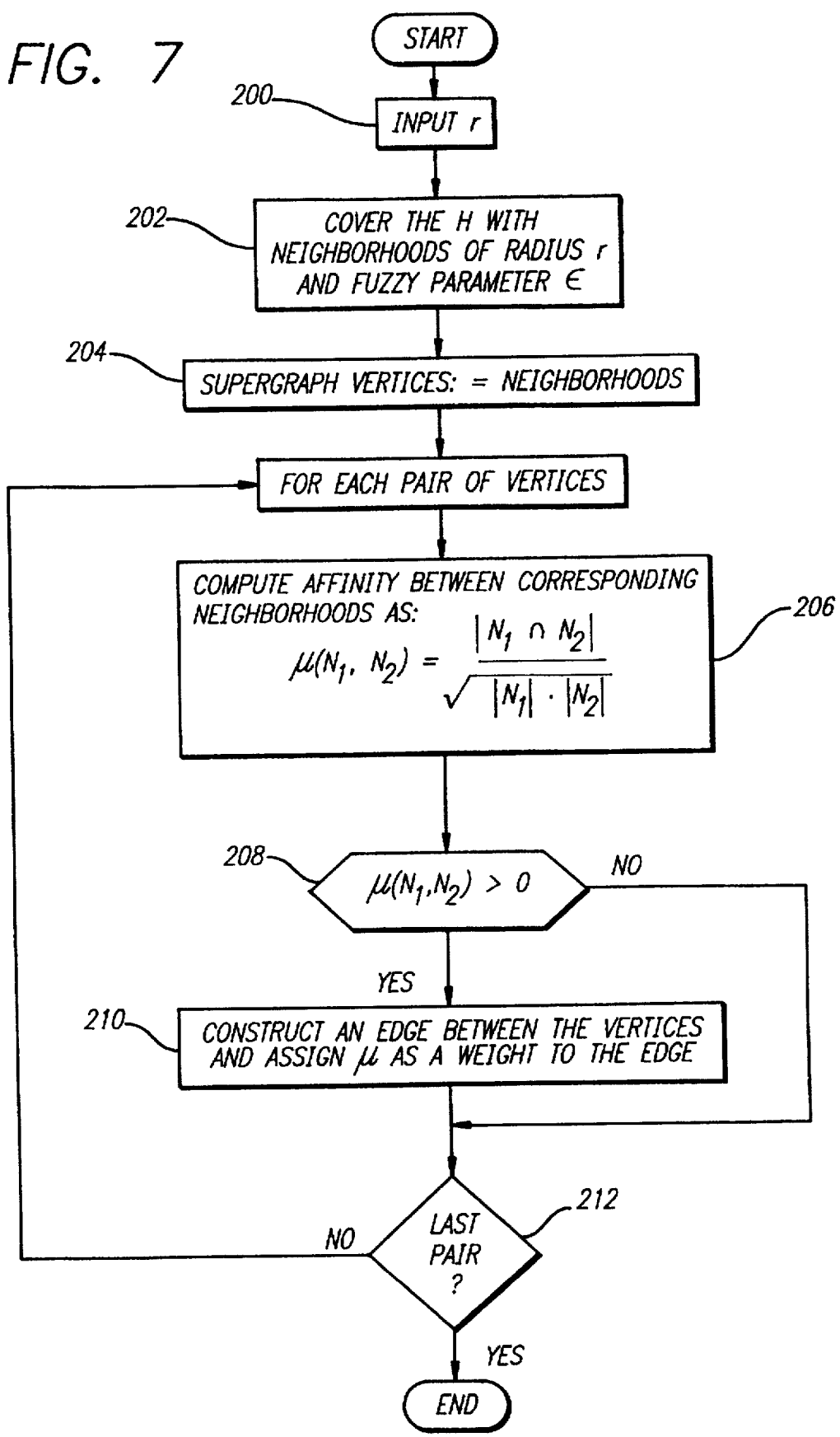
FIG. 7 is a block diagram illustrating a method of clusterizing a netlist or hypergraph, and calculating an affinity between each pair of clusters.

FIG. 7 is a flowchart illustrating how all cells (or a specified group of cells) of an integrated circuit chip are assigned to clusters in accordance with the present invention. This process also generates "affinities" or "weights" between each pair of clusters in accordance with the netlist interconnections to facilitate placement using a force directed placement or other algorithm.

The first step 200 is to specify a radius r as described above. The next step 202 is to generate clusters or neighborhoods that include all cells which are to be placed. Step 202 includes the steps described above with reference to FIG. 5 for generating each individual cluster.

After the first cluster is generated, a center v for the next cluster must be specified. This can be done in a number of ways, preferably by selecting a cell at random and measuring the distance of the cell from the closest cell that has already been included in some neighborhood.

If the distance is longer than a predetermined value, the cell is used as the center v of the next cluster. If not, the process is continued until a cell having a distance larger than the predetermined value is identified. The predetermined value depends on the constraints of a particular application, and generally increases with the desired radius of the clusters or neighborhoods.

This process is repeated for each new cluster to be generated. A cell which is tentatively selected to constitute a new center is used only if it has the predetermined distance relationship with all previously generated clusters. The process is terminated when all cells have been assigned to clusters or neighborhoods.

A point can be reached in the clusterization process at which no new cells can be found which are further than the predetermined distance from the closest cluster. However, all cells should be included in some cluster. This is accomplished by progressively reducing the predetermined value until cells are found that meet the criterion. The process is repeated with the predetermined value being progressively reduced until all cells have been assigned to clusters, with the cells being added in order of distance from their closest cluster.

Since the clusters are grown from centers and have a predetermined maximum size, it is possible and generally desirable for some cells to be included in more than one, preferably several clusters. This is the "fuzzy" relationship that enables routing decisions to be delayed while hierarchical placement is being performed, and allows cells to move between clusters.

However, it is further within the scope of the invention to generate "crisp" clusters, such that no cell is included in more than one cluster. This can be accomplished by performing the present method such that once a cell is assigned to a cluster, it is removed from consideration and not assigned to another cluster even if it is included in a net which is assigned to a border in another cluster.

In order to enable placement of the clusters, a relationship between the clusters must be established. This is provided in accordance with the present invention in the form of "affinities" or "weights" between clusters. An affinity is an attractive force between two clusters. This enables the clusters to be modelled as masses connected by springs or edges, such that the clusters can be placed using a force directed placement methodology. It will be noted that the affinities can be replaced by "penalties" for associating two clusters closely together, with a penalty constituting a negative affinity.

As indicated as a step 204 in FIG. 7, a "supergraph" is a graph whose vertices are clusters or neighborhoods and the edges are constructed between two vertices if the affinity between the two corresponding clusters is greater than 0. An affinity $\mu(N_1, N_2)$ between two clusters or neighborhoods $N_1$ and $N_2$ can be expressed mathematically as $$\mu(N_1,N_2) = \frac{|N_1 \cap N_2|}{\sqrt{|N_1| \cdot |N_2|}}$$

The affinities $\mu$ are assigned to the corresponding edges.

Figure 10:
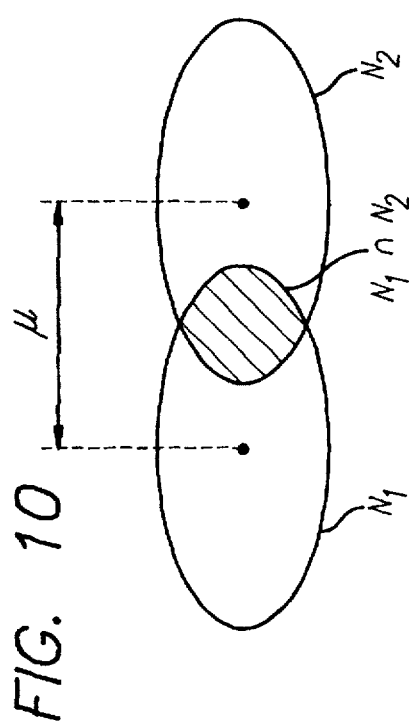
FIG. 10 is a diagram illustrating calculation of an affinity between two clusters.

This is illustrated in FIG. 10. $N_1 \cap N_2$ is shown as a hatched area constituted by the intersection or overlap of the clusters or neighborhoods $N_1$ and $N_2$. This intersection is defined mathematically as the number of cells that are included in the two clusters.

The overlap is "normalized" by dividing the number of overlapped cells by a function of the total numbers of cells in the two clusters. Preferably, this function is the square root of the product of the numbers of cells in the clusters, although the invention is not so limited, and alternative normalizing functions will become apparent to persons of skill in the art after receiving the teachings of the present disclosure.

If the affinity $\rho(N_1, N_2)$ is greater than zero, as determined in a step 208, the affinity is represented as an edge between the clusters (vertices) in a step 210 having a length equal to the numerical value of the affinity or weight calculated in step 206. The affinity will be greater than zero if there is overlap, and zero if there is no overlap.

Step 212 determines if there are more pairs of clusters to process. The method loops back and repeats until an affinity or weight has been calculated between each pair of clusters or neighborhoods.

After the process of FIG. 7 has been completed, a mass and spring model of the clusters has been produced such that the clusters can be placed using force directed placement or the like.

The present method can be performed on a single level as a placement improvement methodology, but is most preferably directed to hierarchial clusterization and placement. In such an application, large clusters are formed and placed. Then, smaller clusters are generated by subdividing the original large clusters, or more preferably by performing complete reclusterization from the cell level using a smaller value of r. The integrated circuit chip area is then subdivided into a pattern of smaller regions, and the smaller clusters are assigned to the smaller regions and placed therein (depending on the positions of the closest large clusters).

This process is continued for a required number of hierarchical levels. At each level, the subregions on the chip are subdivided into smaller subregions, and smaller clusters are generated, assigned to the smaller subregions and placed therein. The process is continued for progressively smaller hierarchical subdivision levels until each cluster consists of a single cell.

The present method can be implemented on a digital computer having a parallel processing capability as described above. The method is highly parallelizable because clusters can be generated, and cluster placement within subregions can be performed in parallel. This enables a substantial reduction in run time in combination with the other advantages of the invention described above.

In summary, the present invention enables quantitative distances between cells to be specified, even though these distances are based entirely on netlist interconnections and do not have any actual physical basis. The present new metric for specifying distances is combined with principles from "fuzzy" logic to reduce the run time of the invention as implemented on a digital computer, and enable a hierarchical solution to be generated.

As opposed to prior art clusterization methods that generate crisp clusters of cells that can be placed hierarchically, the present method generates fuzzy clusters such that a given cell can belong to two or more clusters. In other words, the clusters can overlap. This enables a decision as to which cells belong to which cluster and thereby the routing pattern to be delayed for the purpose of producing an ultimate cell placement which not only has minimum wirelength, but is also routable.

Various modifications will become possible for those skilled in the art after receiving the teachings of the present disclosure without departing from the scope thereof.

We claim:

1. A computer implemented method for generating a cluster of cells for integrated circuit design, comprising the steps of:
   (a) providing a netlist including cells, and nets of wires interconnecting the cells;
   (b) designating one of the cells as a center;
   (c) specifying a metric for measuring distance between cells as a function of netlist interconnections;
   (d) specifying a maximum cluster size criterion;
   (e) processing the netlist using said metric to determine distances of cells from the center; and
   (f) assigning cells having progressively increasing distances from the center to the cluster until said maximum cluster size criterion is reached.

2. A method as in claim 1, in which:
   step (d) comprises specifying said maximum cluster size criterion as a maximum distance from the center;
   step (e) comprises processing the netlist using said metric to determine which of the cells are not further than said maximum distance from the center; and
   step (f) comprises assigning cells that are not further than said maximum distance from the center to the cluster.

3. A method as in claim 2, in which step (c) comprises the substeps of:
   (g) defining a length of a net as a number of cells interconnected by said net minus one; and
   (h) defining a distance between two cells as a sum of lengths of nets that provide a shortest path between said two cells.

4. A method as in claim 3, in which step (e) comprises the substeps of:
   (i) defining a range of a net as a length of said net, plus a shortest distance between any cell in said net and the center;

(j) processing the netlist to determine which of the nets have ranges that do not exceed said maximum distance; and
   step (f) comprises assigning cells interconnected by said nets having ranges that are not greater than said maximum distance to the cluster.

5. A method as in claim 4, in which step (j) comprises the substeps of:
   (k) determining nets that are connected directly to the center and have ranges less than said maximum distance;
   (l) determining nets that are connected directly to said nets determined in step (k) and have ranges less than said maximum distance; and
   step (f) comprises assigning cells of said nets determined in steps (k) and (l) to the cluster.

6. A method as in claim 5, in which step (j) further comprises the step of:
   (m) determining nets that are connected to the center by progressively increasing numbers of other nets and have ranges less than said maximum distance; and
   step (f) comprises assigning cells of said nets determined in step (m) to the cluster.

7. A method as in claim 6, in which steps (k), (l) and (m) comprise defining borders as having indices equal to ranges of nets respectively, and processing nets in said borders having progressively increasing indices.

8. A method as in claim 1, in which step (c) comprises the substeps of:
   (g) defining a length of a net as a number of cells interconnected by said net minus one; and
   (h) defining a distance between two cells as a sum of lengths of nets that provide a shortest path between said two cells.

9. A method as in claim 8, in which step (e) comprises the substeps of:
   (i) defining a range of a net as a length of said net, plus a shortest distance between any cell in said net and the center; and
   (j) processing the netlist to determine ranges of nets; and
   step (f) comprises assigning cells interconnected by said nets having progressively increasing ranges to the cluster until said maximum cluster size criterion is reached.

10. A method as in claim 9, in which step (j) comprises the substeps of:
    (k) determining ranges of nets that are connected directly to the center; and
    (l) determining ranges of nets that are connected directly to said nets determined in step (k); and
    step (f) comprises assigning cells of said nets determined in steps (k) and (l) to the cluster until said maximum cluster size criterion is reached.

11. A method as in claim 10, in which step (j) further comprises the step of:
    (m) determining nets that are connected to the center by progressively increasing numbers of other nets; and
    step (f) comprises assigning cells of said nets determined in step (m) to the cluster until said maximum cluster size criterion is reached.

12. A method as in claim 11, in which steps (k), (l) and (m) comprise defining borders as having indices equal to ranges of nets respectively, and processing nets in said borders having progressively increasing indices.

13. A method as in claim 1, in which:

step (d) comprises specifying said maximum cluster size criterion as a total maximum area of cells assigned to the cluster; and step (f) comprises assigning cells to the cluster until a total area of said cells assigned to the cluster is not smaller than said total maximum area.

14. A method as in claim 1, in which:

step (d) comprises specifying said maximum cluster size criterion as a maximum total height of cells assigned to the cluster; and step (f) comprises assigning cells to the cluster until a total height of said cells assigned to the cluster is not smaller than said total maximum height.

15. A method as in claim 1, in which:

step (d) comprises specifying said maximum cluster size criterion as a maximum number of cells assigned to the cluster; and step (f) comprises assigning cells to the cluster until a number of said cells assigned to the cluster is not smaller than said maximum number.

16. A computer implemented method for generating clusters of cells for integrated circuit design, comprising the steps of:

(a) providing a netlist including cells, and nets of wires interconnecting the cells;

(b) specifying a metric for measuring distance between cells as a function of netlist interconnections;

(c) specifying a maximum cluster size criterion which provides a desired amount of overlap between clusters; and (d) generating clusters of cells, each cluster being generated by performing the steps of:

(e) designating one of the cells as a center;

(f) processing the netlist using said metric to determine distances of cells from the center; and (g) assigning cells having progressively increasing distances from the center to the cluster until said maximum cluster size criterion is reached.

17. A method as in claim 16, in which step (e) comprises designating a cell for a new cluster as being further from previously generated clusters than a predetermined distance.

18. A method as in claim 16, in which steps (c) and (d) comprise generating said clusters such that said amount of overlap is zero.

19. A method as in claim 16, in which:

step (c) comprises specifying said maximum cluster size criterion as a maximum distance from the center;

step (e) comprises processing the netlist using said metric to determine which of the cells are not further than said maximum distance from the center; and step (f) comprises assigning cells that are not further than said maximum distance from the center to the cluster.

20. A method as in claim 19, in which step (b) comprises the substeps of:

(h) defining a length of a net as a number of cells interconnected by said net minus one; and (i) defining a distance between two cells as a sum of lengths of nets that provide a shortest path between said two cells.

21. A method as in claim 20, in which step (f) comprises the substeps of:

(j) defining a range of a net as a length of said net, plus a shortest distance between any cell in said net and the center;

(k) processing the netlist to determine which of the nets have ranges that do not exceed said maximum distance; and step (g) comprises assigning cells interconnected by said nets having ranges that are not greater than said maximum distance to the cluster.

22. A method as in claim 21, in which step (k) comprises the substeps of:

(l) determining nets that are connected directly to the center and have ranges less than said maximum distance;

(m) determining nets that are connected directly to said nets determined in step (k) and have ranges less than said maximum distance; and step (g) comprises assigning cells of said nets determined in steps (l) and (m) to the cluster.

23. A method as in claim 22, in which step (k) further comprises the step of:

(n) determining nets that are connected to the center by progressively increasing numbers of other nets and have ranges less than said maximum distance; and step (g) comprises assigning cells of said nets determined in step (m) to the cluster.

24. A method as in claim 23, in which steps (l), (m) and (n) comprise defining borders as having indices equal to ranges of nets respectively, and processing nets in said borders having progressively increasing indices.

25. A method as in claim 16, in which step (b) comprises the substeps of:

(h) defining a length of a net as a number of cells interconnected by said net minus one; and (i) defining a distance between two cells as a sum of lengths of nets that provide a shortest path between said two cells.

26. A method as in claim 25, in which step (f) comprises the substeps of:

(j) defining a range of a net as a length of said net, plus a shortest distance between any cell in said net and the center; and (k) processing the netlist to determine ranges of nets; and step (g) comprises assigning cells interconnected by said nets having progressively increasing ranges to the cluster until said maximum cluster size criterion is reached.

27. A method as in claim 26, in which step (k) comprises the substeps of:

(l) determining ranges of nets that are connected directly to the center; and (m) determining ranges of nets that are connected directly to said nets determined in step (k); and step (g) comprises assigning cells of said nets determined in steps (k) and (l) to the cluster until said maximum cluster size criterion is reached.

28. A method as in claim 27, in which step (k) further comprises the step of:

(n) determining nets that are connected to the center by progressively increasing numbers of other nets; and step (g) comprises assigning cells of said nets determined in step (m) to the cluster until said maximum cluster size criterion is reached.

29. A method as in claim 28, in which steps (l), (m) and (n) comprise defining borders as having indices equal to ranges of nets respectively, and processing nets in said borders having progressively increasing indices.

30. A method as in claim 16, in which:

step (c) comprises specifying said maximum cluster size criterion as a total maximum area of cells assigned to the cluster; and step (g) comprises assigning cells to the cluster until a total area of said cells assigned to the cluster is not smaller than said total maximum area.

31. A method as in claim 16, in which:

step (c) comprises specifying said maximum cluster size criterion as a maximum total height of cells assigned to the cluster; and step (g) comprises assigning cells to the cluster until a total height of said cells assigned to the cluster is not smaller than said total maximum height.

32. A method as in claim 16, in which:

step (c) comprises specifying said maximum cluster size criterion as a maximum number of cells assigned to the cluster; and step (g) comprises assigning cells to the cluster until a number of said cells assigned to the cluster is not smaller than said maximum number.

33. A method as in claim 16, further comprising the steps of:

(h) calculating affinities between each pair of clusters; and (i) determining a placement of said clusters such that a cost function based on said affinities is substantially minimized.

34. A method as in claim 33, in which step (h) comprises calculating an affinity between two clusters as a number of cells which are common to said two clusters divided by a function of the numbers of cells in said two clusters.

35. A method as in claim 34, in which said function is a square root of a product of said numbers of cells in said two clusters.

36. A method as in claim 33, in which step (i) comprises determining said placement of said clusters using a force directed placement methodology.

* * * * *